(12) United States Patent
Parimi et al.

(10) Patent No.: US 12,255,054 B2
(45) Date of Patent: Mar. 18, 2025

(54) METHODS TO ELIMINATE OF DEPOSITION ON WAFER BEVEL AND BACKSIDE

(71) Applicant: Applied Materials, Inc., Santa Clara, CA (US)

(72) Inventors: Venkata Sharat Chandra Parimi, Sunnyvale, CA (US); Zubin Huang, Santa Clara, CA (US); Manjunath Veerappa Chobari Patil, Karnataka (IN); Nitin Pathak, Mumbai (IN); Yi Yang, San Jose, CA (US); Badri N. Ramamurthi, Los Gatos, CA (US); Truong Van Nguyen, Milpitas, CA (US); Rui Cheng, San Jose, CA (US); Diwakar Kedlaya, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 714 days.

(21) Appl. No.: 17/127,201

(22) Filed: Dec. 18, 2020

(65) Prior Publication Data
US 2022/0199373 A1  Jun. 23, 2022

(51) Int. Cl.
*H01J 37/32* (2006.01)
*C23C 16/44* (2006.01)
(Continued)

(52) U.S. Cl.
CPC .... *H01J 37/32623* (2013.01); *C23C 16/4408* (2013.01); *C23C 16/4583* (2013.01);
(Continued)

(58) Field of Classification Search
CPC ........... H01J 37/32623; H01J 37/32715; H01J 2237/2007; C23C 16/4408; C23C 16/4583; C23C 16/50
(Continued)

(56) References Cited

U.S. PATENT DOCUMENTS

| | | | |
|---|---|---|---|
| 5,304,248 | A | 4/1994 | Cheng et al. |
| 6,033,480 | A | 3/2000 | Chen et al. |

(Continued)

FOREIGN PATENT DOCUMENTS

| | | |
|---|---|---|
| CN | 111952233 A | 11/2020 |
| JP | H07-022340 A | 1/1995 |

(Continued)

OTHER PUBLICATIONS

International Search Report and Written Opinion mailed Mar. 30, 2022 in International Patent Application No. PCT/US2021/062203, 10 pages.

*Primary Examiner* — Ori Nadav
(74) *Attorney, Agent, or Firm* — Kilpatrick Townsend & Stockton LLP

(57) ABSTRACT

Exemplary semiconductor processing chambers include a chamber body defining a processing region. The chambers may include a substrate support disposed within the processing region. The substrate support may have an upper surface that defines a recessed substrate seat. The chambers may include a shadow ring disposed above the substrate seat and the upper surface. The shadow ring may extend about a peripheral edge of the substrate seat. The chambers may include bevel purge openings defined within the substrate support proximate the peripheral edge. A bottom surface of the shadow ring may be spaced apart from a top surface of the upper surface to form a purge gas flow path that extends from the bevel purge openings along the shadow ring. A space formed between the shadow ring and the substrate seat may define a process gas flow path. The gas flow paths may be in fluid communication with one another.

17 Claims, 6 Drawing Sheets

(51) Int. Cl.
*C23C 16/458* (2006.01)
*C23C 16/50* (2006.01)
(52) U.S. Cl.
CPC ........ *C23C 16/50* (2013.01); *H01J 37/32715* (2013.01); *H01J 2237/2007* (2013.01); *H01J 2237/20235* (2013.01); *H01J 2237/332* (2013.01)
(58) Field of Classification Search
USPC ........................................................ 438/758
See application file for complete search history.

(56) References Cited

U.S. PATENT DOCUMENTS

| | | | | |
|---|---|---|---|---|
| 6,096,404 A * | 8/2000 | Ghantiwala | ............ | H01L 22/34 118/721 |
| 7,422,637 B2 * | 9/2008 | Ku | .................... | C23C 16/45521 156/345.55 |
| 7,648,579 B2 | 1/2010 | Goodman et al. | | |
| 11,674,226 B2 * | 6/2023 | Shaikh | ............. | H01J 37/32623 118/728 |
| 2003/0188685 A1 * | 10/2003 | Wang | .................. | C23C 16/4404 204/298.11 |
| 2014/0291286 A1 * | 10/2014 | Okayama | .......... | C23C 16/45519 239/548 |
| 2015/0107772 A1 * | 4/2015 | Uchida | ............. | C23C 16/45565 156/345.33 |
| 2017/0101712 A1 * | 4/2017 | Bansal | ............. | C23C 16/45565 |

FOREIGN PATENT DOCUMENTS

| | | |
|---|---|---|
| KR | 2014-0045806 A | 4/2014 |
| TW | I275124 B | 3/2007 |
| TW | I537409 B | 6/2016 |
| TW | I571929 B | 2/2017 |
| TW | 202002126 A | 1/2020 |

* cited by examiner

METHODS TO ELIMINATE OF DEPOSITION ON WAFER BEVEL AND BACKSIDE

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. The discontinuity of a wafer edge may result in the deposition of these gases a bevel of the wafer, which may have a large impact on yield as the far edge film thickness variation affects a large number of device dies at the wafer edge.

Thus, there is a need for improved systems and methods that can be used to produce high quality devices and structures. These and other needs are addressed by the present technology.

SUMMARY

Exemplary semiconductor processing chambers may include a chamber body defining a processing region. The chambers may include a substrate support disposed within the processing region. The substrate support may have an upper surface that defines a substrate seat that is recessed relative to the upper surface. The chambers may include a shadow ring disposed above the substrate seat and the upper surface. The shadow ring may extend about a peripheral edge of the substrate seat. The chambers may include a plurality of bevel purge openings defined within the substrate support proximate the peripheral edge of the substrate seat. A bottom surface of the shadow ring may be spaced apart from a top surface of the upper surface to form a purge gas flow path that extends from the plurality of bevel purge openings along an underside of the shadow ring. A space formed between the shadow ring and the substrate seat may define a portion of a process gas flow path. The process gas flow path and the purge gas flow paths may be in fluid communication with one another.

In some embodiments, the substrate support may be translatable in a vertical direction within the processing chamber between a processing position and a transfer position. A bottom surface of the shadow ring and a top surface of the substrate support may each include corresponding locating features that engage when the substrate support is in the processing position to align the shadow ring and substrate support and to set a distance between the bottom surface of the shadow ring and a top surface of the substrate support. The chambers may include a purge gas source. A shaft of the substrate support defines a fluid lumen that couples the purge gas source with the plurality of bevel purge openings. The substrate support may define a number of recursive channels that fluidly couple the fluid lumen with the plurality of bevel purge openings. A bottommost edge of the shadow ring may be supported above the substrate seat by a distance that is greater than a thickness of a substrate being processed such that a gap is formed between the substrate and the bottommost edge. An underside of the shadow ring may taper upward from the bottommost edge to an elevated surface that defines a portion of the purge gas flow path. The elevated surface may be positioned above the upper surface of the substrate support. The process gas flow path and the purge gas flow may intersect at a position proximate the bottommost edge of the shadow ring. The substrate support may include a vacuum chuck disposed within the substrate seat. The chambers may include a faceplate positioned at a top end of the processing region. The process gas flow path may extend from the faceplate through the space formed between the shadow ring and the substrate seat. A distance between the faceplate and shadow ring may be greater than the distance between the bottom surface of the shadow ring and the upper surface of the substrate support. A distance between the faceplate and shadow ring may be less than the distance between the bottom surface of the shadow ring and the upper surface of the substrate support.

Some embodiments of the present technology may encompass semiconductor processing chambers. The chambers may include a chamber body defining a processing region. The chambers may include a faceplate positioned at a top end of the processing region. The chambers may include a substrate support disposed within the processing region. The substrate support may have an upper surface that defines a substrate seat that is recessed relative to the upper surface. The chambers may include a shadow ring disposed above the substrate seat and the upper surface. The shadow ring may extend about a peripheral edge of the substrate seat. The chambers may include a number of bevel purge openings defined within the substrate support proximate the peripheral edge of the substrate seat. A bottom surface of the shadow ring may be spaced apart from a top surface of the upper surface to form a purge gas flow path that extends from the number of bevel purge openings along an underside of the shadow ring. A process gas flow path may be defined that extends from the faceplate to a space formed between the shadow ring and the substrate seat. The process gas flow path and the purge gas flow paths may be in fluid communication with one another.

In some embodiments, a bottommost edge of the shadow ring may be supported above the substrate seat by a distance that is greater than a thickness of a substrate being processed such that a gap is formed between the substrate and the bottommost edge. The gap may provide a clearance of between or about 0.005 and 0.045 inches when the substrate support is in a processing position. A distance between the faceplate and the shadow ring may be between or about 0.01 and 1.0 inch when the substrate support is in a processing position. A distance between bottommost edge of the shadow ring and a top surface of the substrate seat may be between or about 0 inches and 0.3 inches when the substrate support is in a processing position. A bottommost edge of the shadow ring may be substantially aligned with the upper surface of the substrate support.

Some embodiments of the present technology may encompass methods of processing a semiconductor substrate. The methods may include flowing a precursor into a processing chamber. The chamber may include a substrate support having an upper surface that defines a substrate seat that is recessed relative to the upper surface. The chamber may include a shadow ring disposed above the substrate seat and the upper surface. The shadow ring may extend about a peripheral edge of the substrate seat. The precursor may flow into a space formed between the shadow ring and the substrate seat. The methods may include generating a plasma of the precursor within a processing region of the processing chamber. The methods may include depositing a material on the substrate. The methods may include flowing a purge gas through a purge gas flow path that extends from a plurality of bevel purge openings along an underside of the shadow ring. A flow of the precursor may be in fluid communication with the purge gas flow path. In some embodiments, flowing the purge gas may include flowing at least or about 1 L of purge gas through the plurality of bevel purge openings. The methods may include venting the precursor through the formed between the shadow ring and the substrate seat and the purge gas flow path.

Such technology may provide numerous benefits over conventional systems and techniques. For example, embodiments of the present technology may provide semiconductor processing chambers that may reduce deposition at the bevel relative to conventional technologies and provide more uniform film thickness across a surface of the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
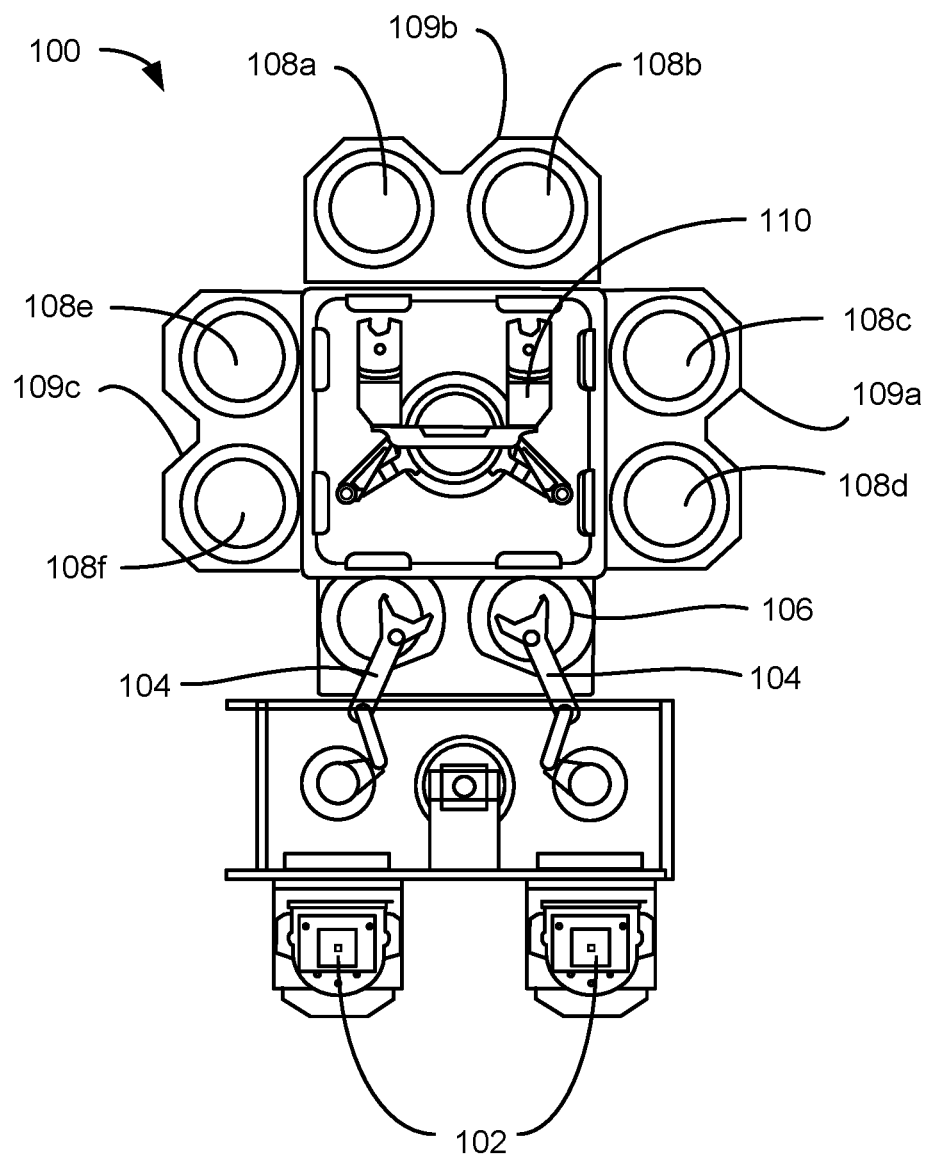
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Wafer bevel film management is a critical aspect of hardmask film deposition, as this affects the downstream processes as poor quality film leads to defects that eventually fall onto the wafer and become killer defects. Another aspect of bevel management is the far-edge film thickness. Typically, the discontinuity of the wafer edge results in a drastic change of the film thickness at the bevel as compared to the bulk film. This creates difficulties in subsequent etch steps and in uniformity of further layers deposited on top of the film. This has a significant impact on yield as the far edge film thickness variation affects a large number of device dies at the wafer edge as the area increases proportionally with the square of the radius.

Conventional systems may manage bevel film thickness by utilizing bevel purge systems that reduce or remove deposition of film on the bevel. To further reduce bevel deposition, conventional approaches include increasing the flow of purge gas to further reduce the diffusion of precursor gas to the wafer bevel. This may lead to lower film thickness on the wafer edge due to diffusion of bevel purge gas onto the wafer top side and subsequent dilution of the precursor gas. To compensate for the increased flow of bevel purge gas, the diluent content (such as argon) in the process gas may be increased to increase the momentum of the process gas flow to counter the bevel purge diffusion onto the wafer top. However, increased dilution of the process gas may result in a lower deposition rate, which must therefore be compensated by increasing the process temperature to increase the reaction rate. The increased process temperatures may result in a change in loading characteristics and/or a change in film properties. Additionally, the high flows of bevel purge (which may exceed 6,000 sccm), may cause uniformity issues as the high flow of bevel gas through the heat may cause a localized heat loss from the heating element to the purge channel.

To help mitigate the uniformity issues, shadow rings may be utilized that physically shield the edge of the wafer and the bevel film from deposition and increase the effectiveness of the bevel purge in reducing deposition along the bevel of the wafer. However, the use of an overlapping shadow ring may lead to the bevel purge gas being pushed on to the wafer top surface, leading to drastic film thickness reduction near the edge of the wafer.

The present technology overcomes these challenges with shadow rings having geometries that reduce the impact of the bevel purge on the wafer top side film uniformity. Additionally, embodiments may employ techniques to eliminate or reduce the local heat loss. For example, embodiments may utilize heater jackets positioned about the bevel purge line, change the bevel purge recursive path within the heater, use surface modifications (such as, but not limited to, a targeted dimple pattern on the heater and/or emissivity patterns) to tune heat loss, and/or move the bevel purge paths below the heater element.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include shadow rings according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
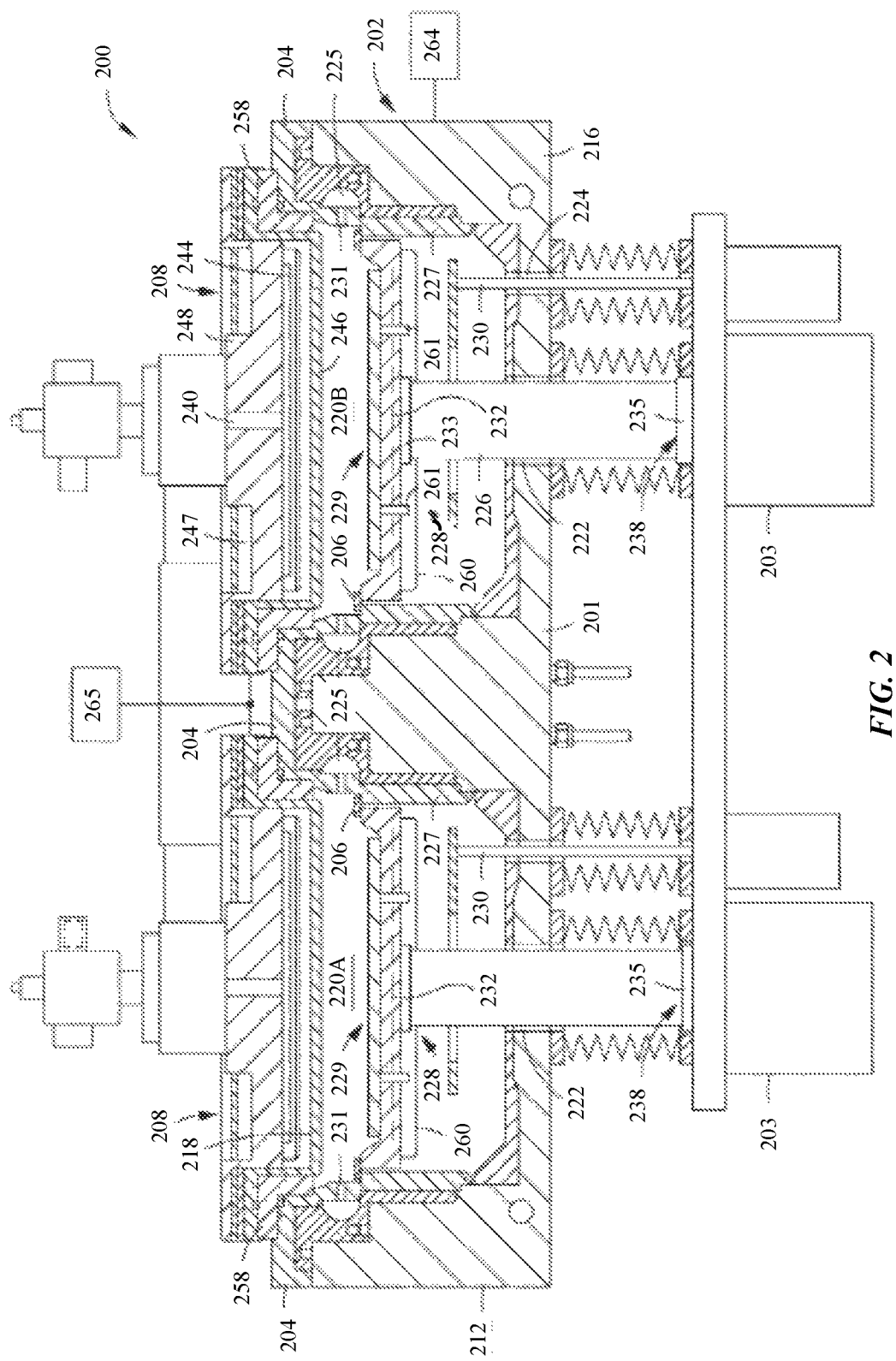
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3A:
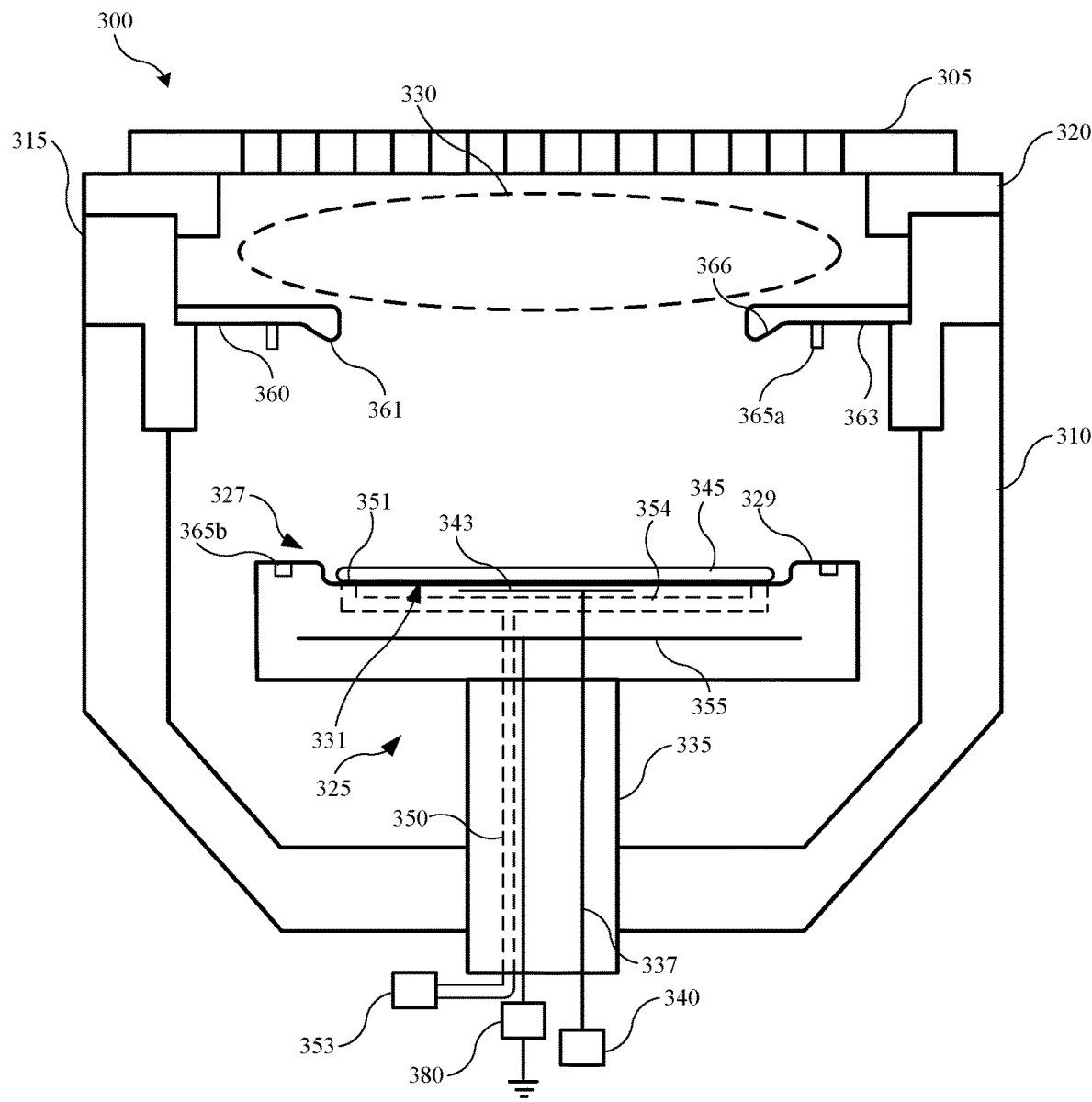
FIG. 3A shows a schematic partial cross-sectional view of an exemplary substrate support assembly in a transfer position according to some embodiments of the present technology.
Figure 3B:
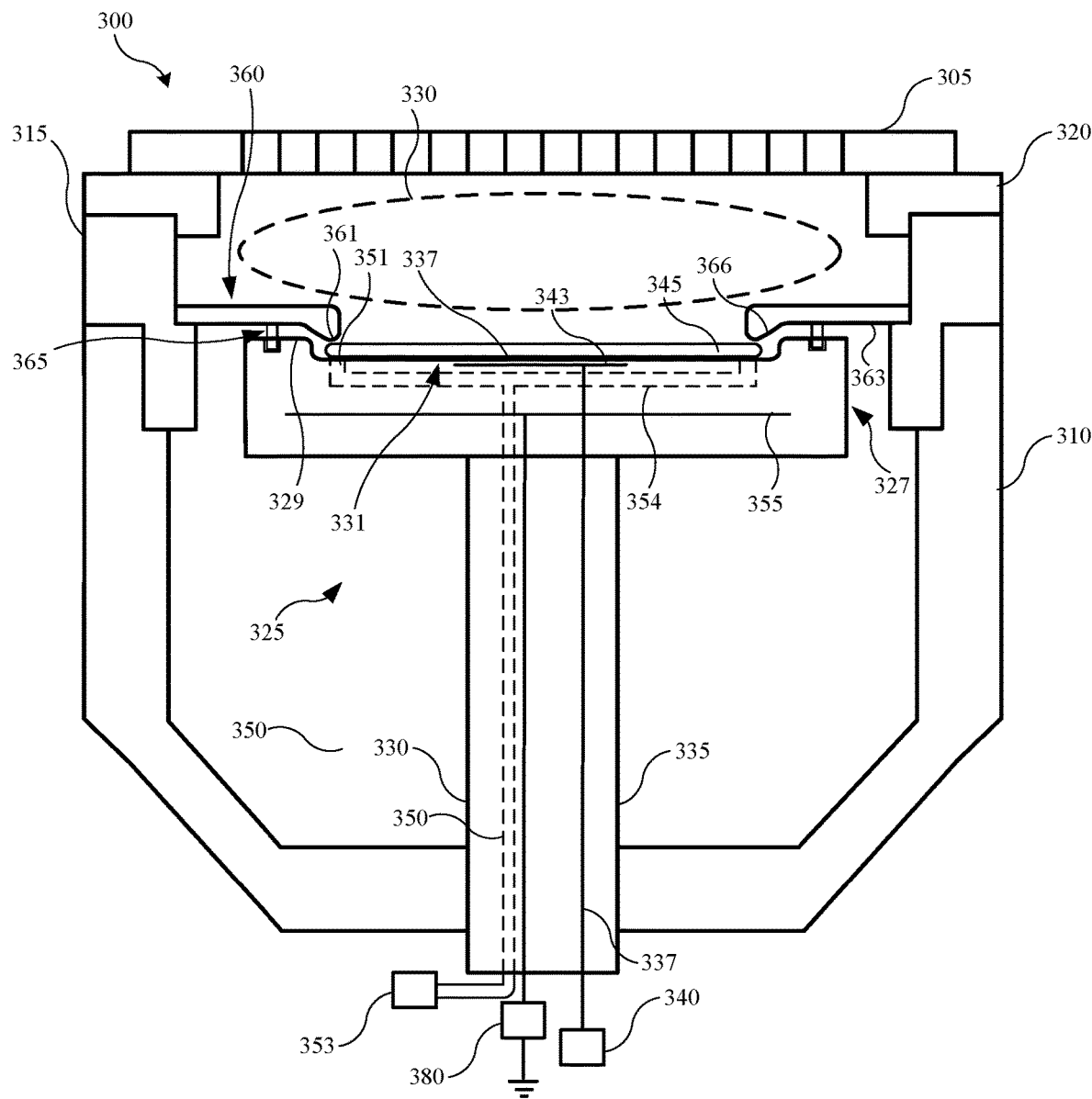
FIG. 3B shows a schematic partial cross-sectional view of the substrate support assembly of FIG. 3A in a process position according to some embodiments of the present technology.

FIGS. 3A and 3B show schematic partial cross-sectional views of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIGS. 3A and 3B may illustrate a portion of a processing chamber 300. The chamber 300 may include a chamber body 310 and a faceplate 305 of a showerhead assembly. The faceplate 305 may be supported, either directly or indirectly, atop the chamber body 310. As just one example, the faceplate 305 may be supported atop a pumping liner 315 and/or a isolator or other liner 320. For example, the pumping liner 315 may be seated on a shelf formed by a top of the chamber body 310, with the additional liner 320 and/or faceplate 305 seated atop the pumping liner 315. Pumping liner 315 may define one or more exhaust ports that enable the venting of gases from the processing region to one or more forelines that are coupled with the processing chamber. Along with chamber body 310, the faceplate 305 and a substrate support 325 may define a substrate processing region 330 in which plasma may be generated.

The substrate support 325 may be vertically translatable within the chamber body 310 between a transfer position (shown in FIG. 3A) and a processing position (shown in FIG. 3B). The substrate support 325 may include one or more components embedded or disposed within the body. The substrate support 325 may define a substrate platform 327 having an upper surface 329, and may be characterized by a thickness and length or diameter depending on the specific geometry of the substrate platform 327. The upper surface 329 may be formed from an edge ring and/or other feature that extends about and defines a substrate seat 331 that is recessed relative to the upper surface 329. In some embodiments the substrate platform 327 may be elliptical, and may be characterized by one or more radial dimensions from a central axis through the substrate platform 327. It is to be understood that the substrate platform 327 may be any geometry, and when radial dimensions are discussed, they may define any length from a central position of the substrate platform 327.

Substrate platform 327 may be coupled with a stem 335, which may support the substrate platform 327 and may include channels as will be discussed below for delivering and receiving electrical and/or fluid lines that may couple with internal components of the substrate platform 327. Substrate platform 327 may include associated channels or components to operate as a vacuum chuck or any other type of chucking system. For example, the stem 335 may define a vacuum lumen 337 that couples a vacuum source 340 with a vacuum interface 343 that is formed within the substrate platform 327. As just one example, the vacuum interface 343 may include one or more vacuum ports and/or channels that are defined within the substrate seat 331. The vacuum source 340 may create a negative pressure that draws a bottom surface of a substrate 345 against the substrate seat 331 prior to any process gases being flowed. This helps seal the bottom surface of the substrate 345 against the substrate seat 331 to protect the bottom surface of the substrate 345 from exposure to process gases.

In some embodiments the substrate platform 327 and/or the stem 335 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the substrate platform 327 and stem 335 in some embodiments. Dopants may be incorporated in some embodiments to adjust electrical properties as will be explained further below. Exemplary dopant materials may include yttrium, magnesium, silicon, iron, calcium, chromium, sodium, nickel, copper, zinc, or any number of other elements known to be incorporated within a ceramic or dielectric material.

Substrate platform 327 may also include an embedded heater 355 contained within the substrate platform 327. Heater 355 may include a resistive heater or a fluid heater in embodiments. Heater 355 may include a polymer heater bonded or coupled with the substrate platform material, although a conductive element may be embedded within the substrate platform body and configured to receive current, such as AC current, to heat the substrate platform 327. The current may be delivered through the stem 335 through a channel formed through the stem 335. Heater 355 may be coupled with a power supply 380, which may provide current to a resistive heating element to facilitate heating of the associated substrate platform 327 and/or substrate 345. Heater 355 may include multiple heaters in embodiments, and each heater may be associated with a zone of the substrate platform 327, and thus exemplary substrate platforms may include a similar number or greater number of zones than heaters.

The heater 355 may be capable of adjusting temperatures across the substrate platform 327, as well as a substrate residing on the substrate platform 327. The heater may have a range of operating temperatures to heat the substrate platform 327 and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater 355 may also be configured to operate in any range encompassed between any two of these stated numbers, or smaller ranges encompassed within any of these ranges. In some embodiments, as will be described further below, the heater 355 may be operated to maintain a substrate temperature above at least 500° C. during deposition operations, such as forming stacks of material for memory devices as previously described.

The stem 335 may define a gas lumen 350 that runs along at least a portion of the length of the stem 335. A top end of the gas lumen 350 may be coupled with a number of bevel purge openings 351. Each of the bevel purge openings 351 may extend through a top surface of the substrate seat 331 at a position proximate an outer periphery of the substrate seat 331 such that the bevel purge openings are at least substantially aligned with at least a portion of the bevel of the substrate 345. A bottom end of the gas lumen 350 may be coupled with a backside gas source 353, which enables the backside gas source 353 to deliver purge gas to an underside of the substrate 345 via the gas lumen 350 and the bevel purge openings 351. In some embodiments, the substrate support defines a number of recursive channels 354 that fluidly couple the top end of the gas lumen 350 with the bevel purge openings 351. The recursive channels 354 may be disposed above or below the heater 355. The recursive channels 354 and bevel purge openings 351 may distribute purge gas about a periphery of the substrate seat 331 to help prevent deposition of plasma at the bevel of substrate 345. In some embodiments, the gas lumen 350, recursive channels 354, and/or bevel purge openings 351 may include heater jackets that may help minimize local heat loss caused from high flows of purge gas through the substrate support 325. In some embodiments, the heater 355 may include a dimple pattern and/or be positioned above the recursive channels 354 to help mitigate local heat loss.

Chamber 300 may also include a shadow ring 360 that may be provided within the processing region 330. For example, the shadow ring 360 may be seated on a shelf or other surface of the chamber body 310 and/or pumping liner 315. In some embodiments, a top surface of the shadow ring 360 may be spaced below a bottom surface of the faceplate 305 by between or about 0.01 inches and 0.08 inches, between or about 0.015 inches and 0.07 inches, between or about 0.02 inches and 0.06 inches, between or about 0.025 inches and 0.05 inches, between or about 0.03 inches and 0.04 inches. The shadow ring 360 may extend inward into an interior region of the processing region 330 such that an inner edge of the shadow ring 360 is positioned above a peripheral edge of the substrate seat 331. For example, the inner edge of the shadow ring 360 may extend over a surface of the substrate seat 331 and/or substrate 345 by a distance of at least or about 1 mm, at least or about 2 mm, at least or about 3 mm, at least or about 4 mm, at least or about 5 mm, at least or about 6 mm, at least or about 7 mm, at least or about 8 mm, at least or about 9 mm, at least or about 10 mm, or more. This enables the shadow ring 360 to mask peripheral edges of the substrate 345 to reduce film thickness along the edge of the substrate 345 and/or otherwise maintain film thickness uniformity across a surface of the substrate 345. An underside of the shadow ring 360 may include a bottommost edge 361 positioned proximate the inner edge. The bottommost edge 361 may include a sloped portion 366 that tapers upward to an elevated surface 363, which may be generally aligned with the upper surface 329 of the substrate platform 327. The sloped portion 366 may help avoid a stagnation zone and enable the purge gas to flow into a main volume of the chamber body 310 below the substrate platform 327. In some embodiments, the bottommost edge 361 may be formed as a protrusion that extends downward from the elevated surface 363 at a position near the inner edge of the shadow ring 360. In some embodiments, the protrusion forming the bottommost edge 361 may extend downward from the elevated surface 363 by between or about 0.01 inches and 0.08 inches, between or about 0.02 inches and 0.07 inches, between or about 0.03 inches and 0.06 inches, between or about 0.04 inches and 0.05 inches, or about 0.045 inches. In some processes, the protrusion may extend downward by a distance of between or about 0.1 inches and 1.0 inch (or greater), between or about 0.2 inches and 0.9 inches, between or about 0.3 inches and 0.8 inches, between or about 0.4 inches and 0.7 inches, or between or about 0.5 inches and 0.6 inches. The thickness of a main body of the shadow ring 360 (proximate the elevated surface 363 and not including the protrusion or sloped portion 366) may be between or about 0.01 inches and 0.08 inches, between or about 0.02 inches and 0.07 inches, between or about 0.03 inches and 0.06 inches, between or about 0.04 inches and 0.05 inches, or about 0.045 inches. In some processes, the thickness of the main body of the shadow ring 360 may be between or about 0.1 inches and 1.0 inch (or greater), between or about 0.2 inches and 0.9 inches, between or about 0.3 inches and 0.8 inches, between or about 0.4 inches and 0.7 inches, or between or about 0.5 inches and 0.6 inches. In some embodiments, the bottommost edge 361 may extend downward from the elevated surface 363 at a distance that is approximately equal to the thickness of the main body of the shadow ring 360. For example, the thickness of the shadow ring 360 at the bottommost edge 361 may be approximately twice the thickness of the main body of the shadow ring 360. The thickness of the shadow ring 360 at the bottommost edge 361 may be between or about 0.04 and 0.14 inches, between or about 0.06 inches and 0.12 inches, between or about 0.08 inches, and 0.10 inches, or about 0.09 inches.

As indicated above, the substrate support 325 is vertically translatable between a transfer position and a process position. To help align the shadow ring 360 and substrate platform 327 when in the process position, the shadow ring 360 and substrate platform 327 may each include corresponding locating features 365 that engage when the substrate support is in the process position to align the shadow ring and substrate support, as well as set a distance between a bottom surface of the shadow ring 360 and the upper surface 329. For example, the locating features 365 may include a combination of pins 365a and receptacles 365b. In some embodiments, a number of pins 365a may be coupled with and/or otherwise protrude from the bottom surface of the shadow ring 360. The upper surface 329 of the support platform 327 may define a number of receptacles 365b that are positioned at locations that are vertically aligned with pins 365a. Each receptacle 365b may have a diameter or other lateral dimension that is sized to be larger than a corresponding dimension of one of the pins 365a. For example, the lateral dimensions of each receptacle 365b may be greater than a corresponding dimension of a corresponding pin 365a by at least or about 1%, at least or about 2%, at least or about 3%, at least or about 4%, at least or about 5%, at least or about 10%, at least or about 15%, at least or about 20%, at least or about 25%, or more. This additional space within each receptacle 365b may provide sufficient tolerance to account for any misalignment or rotation that may occur during the vertical translation of the substrate support 325.

The length of the pins 365a and/or depth of the receptacles 365b may be selected to set a distance between a bottom surface of the shadow ring 360 and the upper surface 329. For example, the length of pins 365a may be greater than the depth of the receptacles 365b, which results in a portion of each pin 365a sticking up above the upper surface 329. The length of this exposed portion of each pin 365a determines a distance between the upper surface 329 and a bottom surface of the shadow ring 360, such as the elevated surface 363. In this manner, the locating features 365 may serve as spacing elements to set a distance between a bottom surface of the shadow ring 360 and the upper surface 329. While illustrated with the pins 365a extending from the shadow ring 360 and the receptacles 365b being formed in the upper surface 329, it will be appreciated that some embodiments may reverse the positioning of the respective locating features 365 and/or incorporate a combination of each type of locating feature 365 on each of the shadow ring 360 and upper surface 329. Moreover, some embodiments may utilize other locating features and/or spacing elements in addition to or in place of pins 365a and/or receptacles 365b.

As illustrated in FIG. 3A, in the transfer position the substrate platform 327 is disposed within a lower portion of the chamber body 310. In this position, the shadow ring 360 is maintained in an upper region of the chamber body 310 and the locating features 365 are disengaged and spaced apart from one another. When the substrate platform 327 is raised upward to the process position, the substrate platform 327 is brought in proximity of the shadow ring 360. For example, as illustrated in FIG. 3B the locating features 365 engage with one another, which sets a distance between the bottom surface of the shadow ring 360 and the upper surface 329, as well as ensures that the shadow ring 360 and substrate platform 327 are in proper alignment with one another.

Figure 3C:
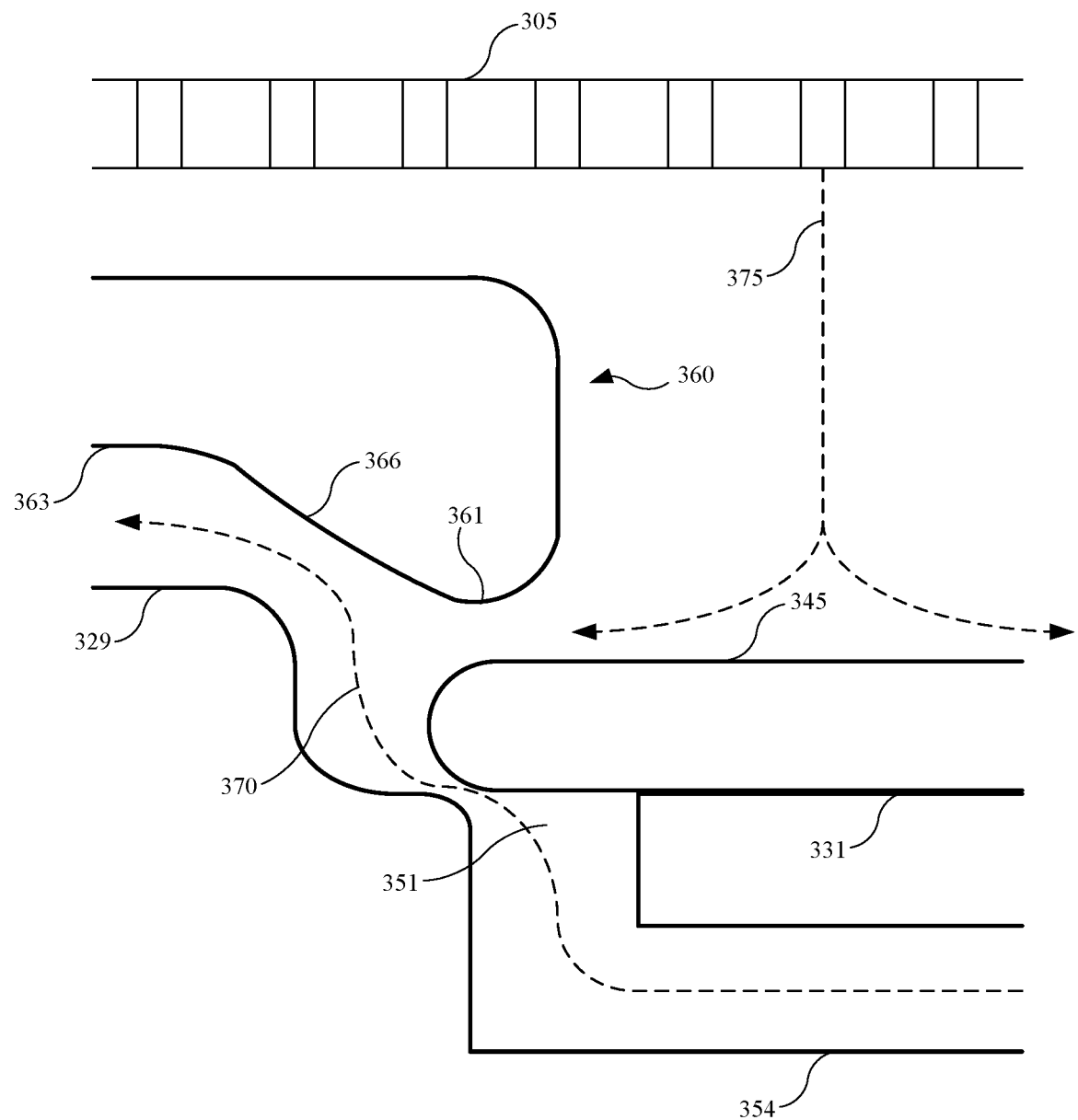
FIG. 3C shows a schematic partial cross-sectional view of components the substrate support assembly of FIG. 3A in a process position according to some embodiments of the present technology.

FIG. 3C illustrates the alignment and spacing of the substrate support 325 and shadow ring 360 when the substrate support 325 is in the process position. As indicated above, in the process position the upper surface 329 is spaced apart from the bottom surface of the shadow ring 360 by the engagement of the locating features 365. For example, the elevated surface 363 may be spaced apart from the upper surface 329 by between or about 0.01 inches and 0.08 inches, between or about 0.02 inches and 0.07 inches, between or about 0.03 inches and 0.06 inches, between or about 0.04 inches, and 0.05 inches, or about 0.045 inches. In some processes, the spacing between the elevated surface 363 and the upper surface 329 may be significantly larger. For example, the spacing may be between or about 0.1 inches and 1.0 inch (or greater), between or about 0.2 inches and 0.9 inches, between or about 0.3 inches and 0.8 inches, between or about 0.4 inches and 0.7 inches, or between or about 0.5 inches and 0.6 inches. The spacing between the elevated surface 363 and the upper surface 329 may be based on a desired flow conductance of gases between the elevated surface 363 and the upper surface 329. The engagement of the locating features 365 may also set a distance between the bottommost edge 361 and the substrate seat 331 and substrate 345. For example, the bottommost edge 361 may elevated above the top surface of the substrate seat 331 by a distance of between or about 0 inches and 0.3 inches, between or about 0.005 inches and 0.25 inches, between or about 0.01 inches and 0.2 inches, between or about 0.015 inches and 0.15 inches, between or about 0.02 inches and 0.1 inches, between or about 0.025 inches and 0.075 inches, between or about 0.03 inches and 0.07 inches, between or about 0.035 inches and 0.06 inches, or about 0.04 inches. This spacing may be greater than a thickness of the substrate 345, resulting in a space or gap being formed between the bottommost edge 361 and the top surface of the substrate 345. For example, for a substrate 345 that is approximately 0.030 inches thick, the gap between the bottommost edge 361 and the top surface of the substrate 345 may have a height of between or about 0.005 and 0.045 inches, between or about 0.006 and 0.04 inches, between or about 0.007 and 0.035 inches, between or about 0.008 and 0.03 inches, between or about 0.009 and 0.025 inches, or about 0.01 inches. By maintaining a small gap size, the gap serves as a choke point and the flow of purge gases onto the substrate 345 and diffusion of precursor toward the bevel of the substrate 345 may be reduced or minimized.

A purge gas flow path, shown by arrow 370, may be formed by the bevel purge openings 351, substrate 345, upper surface 329, and shadow ring 360. For example, purge gases may be flowed out of the bevel purge openings 351, along the side surfaces of the upper surface 329 and the substrate 345, and between the upper surface 329 and the sloped portion 366 and elevated surface 363 of the shadow ring 360. Such a purge gas flow path directs purge gas to the bevel of the substrate 345 to prevent and or remove deposition of process gases on the bevel before directing the purge gas outward below the shadow ring 360 where the gas may be removed via the pumping liner 315. The gap between the bottommost edge 361 and the top surface of the substrate 345 may form a portion of a process gas flow path, as indicated by arrow 375. For example, process gas may be delivered into the processing region via the faceplate 305. The process gas may diffuse along the surface of the substrate 345 toward the bevel of the substrate 345 where the process gas may flow into the gap formed between the bottommost edge 361 and the top surface of the substrate 345.

The process gas flow path and the purge gas flow path may be in fluid communication with one another. For example, the two flow paths may intersect at a position proximate the bottommost edge 361 of the shadow ring 360 where the gap between the bottommost edge 361 and the substrate 345 meets the space between the upper surface 329 and the shadow ring 360. By making the gap between the bottommost edge 361 and the substrate 345 substantially small, the gap may serve as a choke point that enables the flow of gases along the various flow paths to be tuned relative to one another. In particular, a tuning knob may be provided that enables the flow characteristics of the process gas and/or purge gas to be tailored for a given application. As just one example, the distance between the faceplate 305 and top surface of the shadow ring 360 may be greater than the distance between the bottom surface of the elevated surface 363 of the shadow ring 360 and the upper surface 329 of the substrate support 325. Such a configuration may draw at least some of the purge gas through the gap between the bottommost edge 361 and the substrate 345, such as to further reduce deposition proximate the edge regions of the substrate 345. In other embodiments, the distance between the faceplate 305 and top surface of the shadow ring 360 may be less than the distance between the bottom surface of the elevated surface 363 of the shadow ring 360 and the upper surface 329 of the substrate support 325. Such a configuration may draw the purge gas along the arrow 370, with a small amount of the process gas being drawn through the gap between the bottommost edge 361 and the substrate 345. In yet other embodiments, the distance between the faceplate 305 and shadow ring 360 may be substantially equal to the distance between the bottom surface of the elevated surface 363 of the shadow ring 360 and the upper surface 329 of the substrate support 325. In such embodiments, substantially all of the purge gas may flow along the path indicated by arrow 370, while substantially all of the purge gas may remain above the substrate 345 and/or within the gap between the bottommost edge 361 and the substrate 345. For example, the flow of purge gas and process gas may be tuned to intersect proximate the bevel of the substrate 345. In some embodiments, the purge gas may be selected to create an in-situ etch at the bevel. As just one example, for a processing operating using SiH4 and B2H6, NF3 may be flowed through the bevel purge openings 351. The SiH4 and B2H6 may react with the NF3 where the flow paths meet near the bevel of the substrate 345. The reaction may create gaseous SiF4 and B2F6, which may be pumped out of the processing chamber along the purge gas flow path and through the pumping liner 315.

Figure 4:
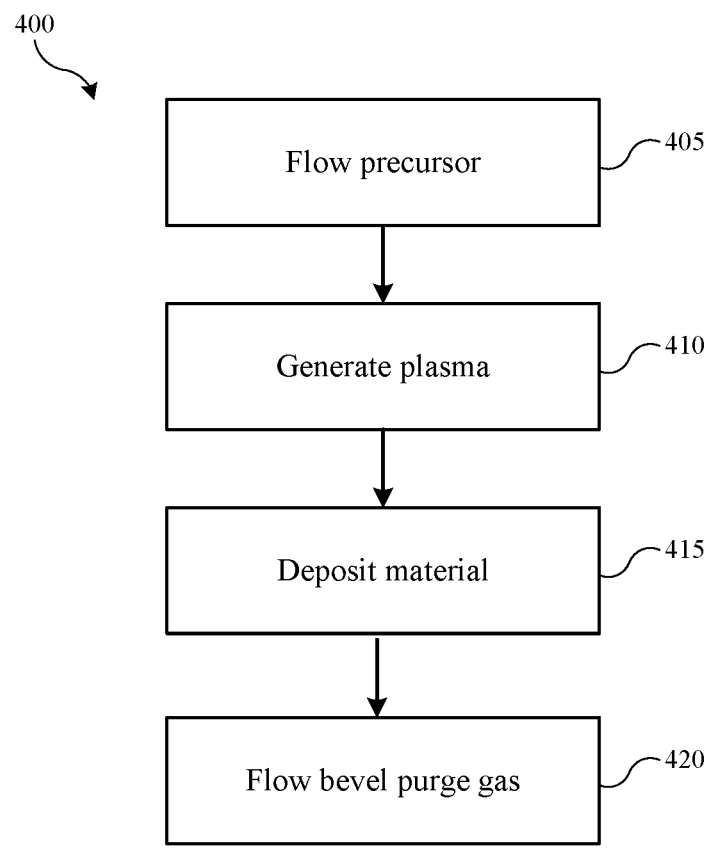
FIG. 4 is a flowchart of an exemplary method of semiconductor processing according to some embodiments of the present technology.

FIG. 4 shows operations of an exemplary method 400 of semiconductor processing according to some embodiments of the present technology. The method 400 may be performed in a variety of processing chambers, including processing system 200 and chamber 300 described above. Method 400 may include a number of optional operations, which may or may not be specifically associated with some embodiments of methods according to the present technology.

Method 400 may include a processing method that may include operations for forming a hardmask film or other deposition operations. The method may include optional operations prior to initiation of method 400, or the method may include additional operations. For example, method 400 may include operations performed in different orders than illustrated. In some embodiments, method 400 may include flowing one or more precursors or other process gases into a processing chamber at operation 405. For example, the precursor may be flowed into a chamber, such as included in system 200 or chamber 300, and may flow the precursor through one or more of a gasbox, a blocker plate, or a faceplate, prior to delivering the precursor into a processing region of the chamber. The chamber may include a substrate support and/or shadow ring as described in relation to FIGS. 3A-3C. The precursor or other process gas may flow from the faceplate and diffuse over the surface of a substrate, including within a gap formed between a bottommost edge of the shadow ring and a top surface of the substrate.

At operation 410, a plasma may be generated of the precursors within the processing region, such as by providing RF power to the faceplate to generate a plasma. Material formed in the plasma may be deposited on the substrate at operation 415. At operation 420, a purge gas may be flowed through a purge gas flow path to remove or prevent deposition of material on the bevel of the substrate. The purge gas may be flowed simultaneously with the flowing of the precursor and/or during generation of the plasma. In some embodiments, the purge gas may be flowed prior to the generation of plasma. In other embodiments, deposition may be purely thermal, without any generation of plasma. In such embodiments, the purge gas may be flowed before, during, and/or after flowing the precursor. The purge gas flow path may extends from a plurality of bevel purge openings along an underside of the shadow ring. A flow of the precursor may be in fluid communication with the purge gas flow path, such as by intersecting with the purge gas flow path at a position proximate the gap formed between a bottommost edge of the shadow ring and a top surface of the substrate. In some embodiments, the purge gas, such as argon, may be flowed at a rate of at least or about 0.1 L/min, at least or about 0.2 L/min, at least or about 0.3 L/min, at least or about 0.4 L/min, at least or about 0.5 L/min, at least or about 0.6 L/min, at least or about 0.7 L/min, at least or about 0.8 L/min, at least or about 0.9 L/min, at least or about 1.0 L/min, at least or about 1.5 L/min, at least or about 2.0 L/min, at least or about 3.0 L/min, at least or about 4.0 L/min, at least or about 5.0 L/min, at least or about 6.0 L/min, at least or about 7.0 L/min, at least or about 8.0 L/min, at least or about 9.0 L/min, at least or about 10.0 L/min, or more.

In some embodiments, the flow of precursor and/or purge gas may be tuned by adjusting a distance between the faceplate and the shadow ring and/or a distance between the upper surface of the substrate support and a bottom surface of the shadow ring such as described above in relation to FIG. 3C. For example, in some embodiments, at least some of the precursor may be vented through the gap formed between a bottommost edge of the shadow ring and a top surface of the substrate and through the purge gas flow path. In other embodiments, at least some of the purge gas may flow through the gap. In other embodiments, substantially all (e.g., greater than or about 90%, greater than or about 93%, greater than or about 95%, greater than or about 96%, greater than or about 97%, greater than or about 98%, greater than or about 99%, or more) of the process gas is maintained on an interior side of the gap while substantially all of the purge gas is maintained on an exterior side of the gap.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing chamber, comprising:
   a chamber body defining a processing region and having one or more sidewalls;
   a pumping liner seated on the chamber body;
   a substrate support disposed within the processing region, the substrate support having an upper surface that defines a substrate seat that is recessed relative to an outer region of the upper surface;
   a shadow ring disposed above the substrate seat and the upper surface, the shadow ring seated on a surface of the one or more sidewalls of the chamber body or the pumping liner and extending about a peripheral edge of the substrate seat;
   a plurality of bevel purge openings defined within the substrate support proximate the peripheral edge of the substrate seat, wherein:
      a bottom surface of the shadow ring is spaced apart from a top surface of the upper surface to form a purge gas flow path that extends from the plurality of bevel purge openings along an underside of the shadow ring;

a space formed between the shadow ring and the substrate seat defines a portion of a process gas flow path; and the process gas flow path and the purge gas flow paths are in fluid communication with one another.

2. The semiconductor processing chamber of claim 1, wherein:

the substrate support is translatable in a vertical direction within the processing chamber between a processing position and a transfer position.

3. The semiconductor processing chamber of claim 2, wherein:

a bottom surface of the shadow ring and a top surface of the substrate support each comprise corresponding locating features that engage when the substrate support is in the processing position to align the shadow ring and substrate support and to set a distance between the bottom surface of the shadow ring and a top surface of the substrate support.

4. The semiconductor processing chamber of claim 1, further comprising:

a purge gas source, wherein a shaft of the substrate support defines a fluid lumen that couples the purge gas source with the plurality of bevel purge openings.

5. The semiconductor processing chamber of claim 4, wherein:

the substrate support defines a number of recursive channels that fluidly couple the fluid lumen with the plurality of bevel purge openings.

6. The semiconductor processing chamber of claim 1, wherein:

a bottommost edge of the shadow ring is supported above the substrate seat by a distance that is greater than a thickness of a substrate being processed such that a gap is formed between the substrate and the bottommost edge.

7. The semiconductor processing chamber of claim 6, wherein:

an underside of the shadow ring tapers upward from the bottommost edge to an elevated surface that defines a portion of the purge gas flow path; and the elevated surface is positioned above the upper surface of the substrate support.

8. The semiconductor processing chamber of claim 6, wherein:

the process gas flow path and the purge gas flow intersect at a position proximate the bottommost edge of the shadow ring.

9. The semiconductor processing chamber of claim 1, wherein:

the substrate support further comprises a vacuum chuck having one or more vacuum ports that are defined within the substrate seat.

10. The semiconductor processing chamber of claim 1, further comprising:

a faceplate positioned at a top end of the processing region, wherein the process gas flow path extends from the faceplate through the space formed between the shadow ring and the substrate seat.

11. The semiconductor processing chamber of claim 10, wherein:

a distance between the faceplate and shadow ring is greater than the distance between the bottom surface of the shadow ring and the upper surface of the substrate support.

12. The semiconductor processing chamber of claim 10, wherein:

a distance between the faceplate and shadow ring is less than the distance between the bottom surface of the shadow ring and the upper surface of the substrate support.

13. A semiconductor processing chamber, comprising:

a chamber body defining a processing region and having one or more sidewalls;

a pumping liner seated on the chamber body;

a faceplate positioned at a top end of the processing region;

a substrate support disposed within the processing region, the substrate support having an upper surface that defines a substrate seat that is recessed relative to an outer region of the upper surface;

a shadow ring disposed above the substrate seat and the upper surface, the shadow ring seated on a surface of the one or more sidewalls of the chamber body or the pumping liner and extending about a peripheral edge of the substrate seat;

a number of bevel purge openings defined within the substrate support proximate the peripheral edge of the substrate seat, wherein:

a bottom surface of the shadow ring is spaced apart from a top surface of the upper surface to form a purge gas flow path that extends from the number of bevel purge openings along an underside of the shadow ring;

a process gas flow path is defined that extends from the faceplate to a space formed between the shadow ring and the substrate seat; and the process gas flow path and the purge gas flow paths are in fluid communication with one another.

14. The semiconductor processing chamber of claim 13, wherein:

a bottommost edge of the shadow ring is supported above the substrate seat by a distance that is greater than a thickness of a substrate being processed such that a gap is formed between the substrate and the bottommost edge; and the gap provides a clearance of between or about 0.005 and 0.045 inches when the substrate support is in a processing position.

15. The semiconductor processing chamber of claim 13, wherein:

a distance between the faceplate and the shadow ring is between or about 0.01 and 1.0 inches when the substrate support is in a processing position.

16. The semiconductor processing chamber of claim 13, wherein:

a distance between bottommost edge of the shadow ring and a top surface of the substrate seat is between or about 0 inches and 0.3 inches when the substrate support is in a processing position.

17. The semiconductor processing chamber of claim 13, wherein:

a bottommost edge of the shadow ring is substantially aligned with the upper surface of the substrate support.

\* \* \* \* \*